(12) United States Patent
Bucci

(10) Patent No.: US 9,507,273 B2
(45) Date of Patent: Nov. 29, 2016

(54) METHOD AND APPARATUS FOR TENSIONING A SHADOW MASK FOR THIN FILM DEPOSITION

(71) Applicant: Advantech Global, Ltd, Tortola (VG)

(72) Inventor: Brian Arthur Bucci, Pittsburgh, PA (US)

(73) Assignee: ADVANTECH GLOBAL, LTD, Tortola (VG)

( * ) Notice: Subject to any disclaimer, the term of this patent is extended or adjusted under 35 U.S.C. 154(b) by 182 days.

(21) Appl. No.: 14/265,773

(22) Filed: Apr. 30, 2014

(65) Prior Publication Data

US 2014/0325822 A1 Nov. 6, 2014

Related U.S. Application Data

(60) Provisional application No. 61/817,974, filed on May 1, 2013.

(51) Int. Cl.
*B05B 15/04* (2006.01)
*C23C 14/04* (2006.01)
(Continued)

(52) U.S. Cl.
CPC ......... *G03F 7/70733* (2013.01); *C23C 14/042* (2013.01); *B05B 15/045* (2013.01); *B05B 15/0456* (2013.01); *B05B 15/0481* (2013.01); *C23C 14/04* (2013.01); *H01J 29/073* (2013.01); *H01J 2229/07* (2013.01); *H01J 2229/0705* (2013.01); *H01J 2229/0711* (2013.01); *H01J 2229/0716* (2013.01); *H01J 2229/0722* (2013.01); *H01J 2229/0727* (2013.01);

(Continued)

(58) Field of Classification Search
CPC . C23C 14/042; C23C 14/04; B05B 15/0481; B05B 15/045; B05B 15/0456; Y10T 29/53961; Y10T 29/49867; H01J 2229/07; H01J 2229/0705; H01J 2229/0711; H01J 2229/0716; H01J 2229/0722; H01J 2229/0727; H01J 29/073; G03F 7/70733
USPC ................... 29/448, 281; 118/213, 301, 406, 118/504–506
See application file for complete search history.

(56) References Cited

U.S. PATENT DOCUMENTS

| | | | | |
|---|---|---|---|---|
| 2,625,734 | A * | 1/1953 | Law ...................... | H01J 9/2272 101/211 |
| 3,894,321 | A * | 7/1975 | Moore ................... | H01J 29/07 313/402 |
| 4,721,488 | A * | 1/1988 | Dougherty ............... | H01J 9/00 29/448 |

(Continued)

FOREIGN PATENT DOCUMENTS

KR 20090110979 A * 10/2009
KR 1020090110979 A 10/2009

*Primary Examiner* — David Bryant
*Assistant Examiner* — Bayan Salone
(74) *Attorney, Agent, or Firm* — The Webb Law Firm

(57) ABSTRACT

In a method and apparatus for shadow mask tensioning, a shadow mask frame and an anchor frame are positioned in spaced relation defining a gap therebetween and a shadow mask is positioned on the shadow mask frame and the anchor frame with an interior portion of the shadow mask extending across the gap. An edge of the shadow mask is affixed to the anchor frame and the shadow mask is tensioned by urging the interior portion of the shadow mask into the gap. Once the shadow mask has been tensioned to a desired extent, the shadow mask is affixed to the shadow mask frame. Thereafter, the combination of the shadow mask affixed to the shadow mask frame is separated from the anchor frame.

16 Claims, 9 Drawing Sheets

(51) Int. Cl.
    *G03F 7/20*      (2006.01)
    *H01J 29/07*     (2006.01)
(52) U.S. Cl.
    CPC ..... *Y10T29/49867* (2015.01); *Y10T 29/53957* (2015.01); *Y10T 29/53961* (2015.01)

(56) References Cited

U.S. PATENT DOCUMENTS

| | | | | |
|---|---|---|---|---|
| 4,772,238 A | * | 9/1988 | Horn | H01J 9/142 29/447 |
| 4,824,412 A | * | 4/1989 | Dougherty | H01J 9/2272 430/23 |
| 4,887,988 A | * | 12/1989 | Canevazzi | H01J 29/073 445/30 |
| 4,894,037 A | * | 1/1990 | Fendley | H01J 9/00 160/371 |
| 5,667,128 A | * | 9/1997 | Rohde | H01L 21/67144 228/49.5 |
| 7,531,216 B2 | * | 5/2009 | Brody | C23C 14/042 427/248.1 |
| 7,674,148 B2 | * | 3/2010 | Griffin | C23C 14/042 445/30 |
| 7,765,669 B2 | * | 8/2010 | Kim | G03F 1/14 118/504 |
| 8,490,271 B2 | * | 7/2013 | Harvilchuck | B44C 1/10 29/448 |
| 2006/0024444 A1 | * | 2/2006 | Brody | C23C 14/042 427/282 |
| 2006/0158088 A1 | * | 7/2006 | Kim | G03F 1/14 313/402 |
| 2007/0190888 A1 | * | 8/2007 | Griffin | C23C 14/042 445/30 |
| 2007/0190889 A1 | * | 8/2007 | Lee | C23C 14/042 445/47 |
| 2009/0146355 A1 | * | 6/2009 | Harvilchuck | B44C 1/10 269/91 |
| 2015/0068456 A1 | * | 3/2015 | Kuriyama | C23C 14/042 118/505 |

\* cited by examiner

METHOD AND APPARATUS FOR TENSIONING A SHADOW MASK FOR THIN FILM DEPOSITION

CROSS REFERENCE TO RELATED APPLICATIONS

The present application claims priority to U.S. Provisional Application No. 61/817,974, filed May 1, 2013, which is hereby incorporated herein by reference.

BACKGROUND OF THE INVENTION

1. Field of the Invention

The present invention generally relates to the field of thin film electronic devices fabricated by additive manufacturing methods. In particular, the present invention is directed to a shadow mask used for patterning materials such as metals, oxides, and OLED compounds.

2. Description of Related Art

There is currently great interest in additive manufacturing methods for fabrication of thin film devices. Such methods would offer an alternative to established methods such as photolithography. Investigating alternatives to photolithography is of interest because photolithography requires significant facility floor space, requires numerous complex steps per patterned feature, and produces significant toxic chemical waste.

It is known in the art of additive manufacturing to employ the method of shadow masking. Shadow masking involves placing a substrate in close proximity or contact with a shadow mask that includes numerous formed apertures. Subsequently, material is deposited through the apertures, yielding the desired pattern on the substrate. Most often several shadow masks are required to produce a desired thin film device. Thus, it is necessary to precisely align the series of shadow masks with reference points on the substrate.

Typically, thin film devices require features to be accurately located within no more than a few micrometers of their specified location. Current alignment methods are capable of accurately placing the center of the shadow mask within less than 1 µm of its desired location. However, the shadow mask typically contains features over a significant area, hereinafter referred to as the "array." Therefore, the size of the array must be controlled very precisely if the features of several masks are to be placed within their specified areas.

Because of the desired patterned feature sizes (typically >100 µm), the shadow mask is typically made of a thin metal foil less than 100 µm thick. Such a thin material does not have the structural integrity to be easily and safely handled on its own. Additionally, the shadow mask will be subject to elevated temperature during the deposition process and it is desired that the apertures of the array remain at constant locations during the thermal cycling. Therefore, tensioning the shadow mask and mounting the shadow mask to a rigid frame allows the shadow mask to be easily and safely handled while being robust to temperature changes.

Heretofore, heat was used to tension the shadow mask before it was attached to the frame. In this method, the frame is made of a low coefficient of thermal expansion alloy, such as invar. The frame and shadow mask are heated to a temperature where the array grows, via thermal expansion, to the proper size and an adhesive bonds the shadow mask to the frame. As the assembly cools, the shadow mask contracts more than the frame resulting in a tensioned shadow mask. This method of thermal tensioning does work but it has limitations and requires significant skill of the fabricator.

One limitation of thermal tensioning is that heat causes the shadow mask to expand proportionally in all directions. This method would be sufficient if all pre-mounted shadow masks are dimensionally accurate to the micrometer level. However, shadow masks often do not start with correct proportions. An example of this concept is shown in FIG. 1. In this example, the particular shadow mask requires more stretch in the horizontal direction than in the vertical direction. The best course of action for mounting this shadow mask using thermal tensioning is to select a mounting temperature that splits the difference between the two desired dimensions. This introduces dimensional inaccuracies to the array of this shadow mask which could cause the shadow mask to become unusable. Therefore, the inability to adjust shadow mask dimensions independently is a limitation of thermal stretching.

When shadow masks are mounted via thermal tensioning, the selected mounting temperature should be higher than the maximum temperature realized at the shadow mask during deposition. When this is done the patterned features are generally observed to remain in their starting locations over the course of the thermal cycling of the deposition. According to observations, this starting location is the "cold" or room temperature dimension of the shadow mask. This differs from the mounting, "hot," dimension of the shadow mask. When the shadow mask cools from the mounting temperature and becomes tensioned, the array changes in dimension. This concept is shown in FIG. 2. This process is somewhat repeatable in that shadow masks with the same aperture pattern tend to deform in the same fashion when transitioning from hot to cold states. However, achieving acceptable shadow mask mounting results requires collecting extensive data on the behavior of shadow masks and significant decision making from the fabricator. Further, transition from hot to cold can result in bowing of the array, a problem that cannot be directly addressed in the thermal tensioning process.

Including an elevated temperature within the mounting process also adds further complications. Introducing an environment of elevated and adjustable temperature greatly complicates the task of making the accurate micrometer scale measurements that are required for a precise shadow mask. Additionally, since it is continually desired to mount shadow masks at increasingly high temperatures, ease of handling and even operator safety become a concern.

SUMMARY OF THE INVENTION

Disclosed herein is a shadow mask tensioning method comprising: (a) positioning a shadow mask frame and an anchor frame in spaced relation defining a gap therebetween; (b) positioning a shadow mask on the shadow mask frame and the anchor frame with a portion of the shadow mask extending across the gap; (c) affixing an edge of the shadow mask to the anchor frame; (d) following steps (a)-(c), tensioning the shadow mask by urging the portion of the shadow mask into the gap; and (e) following step (d), affixing the shadow mask to the shadow mask frame.

Step (c) can include affixing multiple edges of the shadow mask to the anchor frame.

Step (c) can include clamping the edge of the shadow mask between the anchor frame and an anchor bar.

The method can further include (f) following step (e), separating the shadow mask affixed to the shadow mask frame from the anchor frame.

Step (f) can include cutting the portion of the shadow mask extending across the gap.

The shadow mask can include an edge tab, wherein the portion of the shadow mask is the edge tab. Step (c) can include affixing the edge tab of the shadow mask to the anchor frame. Step (f) can include separating the edge tab from the shadow mask affixed to the shadow mask frame.

Step (d) can include affixing to the anchor frame a tensioning frame that supports one or more tension screws in alignment with the gap and adjusting (rotating) each tensioning screw in a manner to urge the portion of the shadow mask into the gap.

The gap and the portion of the shadow mask can surround the shadow mask frame.

Also disclosed herein is a shadow mask tensioning apparatus comprising: means for supporting a shadow mask with an interior portion of the shadow mask in alignment with a gap; means for anchoring one or more edges of the shadow mask; and means for urging the interior portion of the shadow mask into the gap.

The means for supporting can include a shadow mask frame surrounded in spaced relation by an anchor frame defining the gap.

The gap can surround the shadow mask frame.

The means for anchoring can include an anchor bar and the anchor frame sandwiching an edge of the shadow mask therebetween.

The anchor frame can surround the shadow mask frame and define the gap.

The means for urging can include a tensioning frame supporting tensioning screws in alignment with the interior portion of the shadow mask. The tensioning screws can be operative for urging the interior portion of the shadow mask into the gap in response to rotation of the tensioning screws. More particularly, the ends of the tensioning screws can contact and urge the interior portion of the shadow mask into the gap in response to rotation of the tensioning screws.

Each edge of the shadow mask can include an edge tab and the means for anchoring anchors each edge tab.

DESCRIPTION OF THE INVENTION

The present invention will now be described with reference to the accompanying figures where like reference numbers correspond to like elements.

Figure 1:
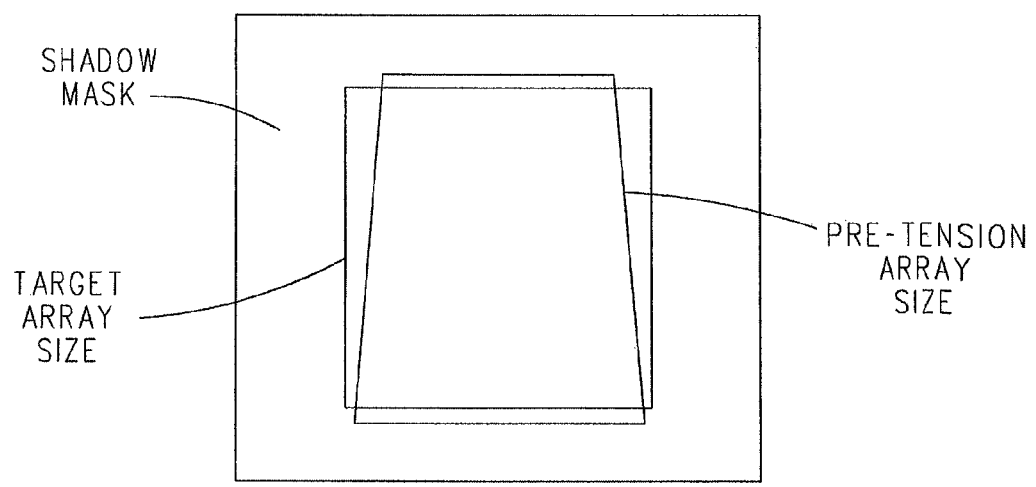
FIG. 1 is an illustration of a difference between a pre-tension shadow mask array size versus a target array size for said shadow mask.
Figure 2:
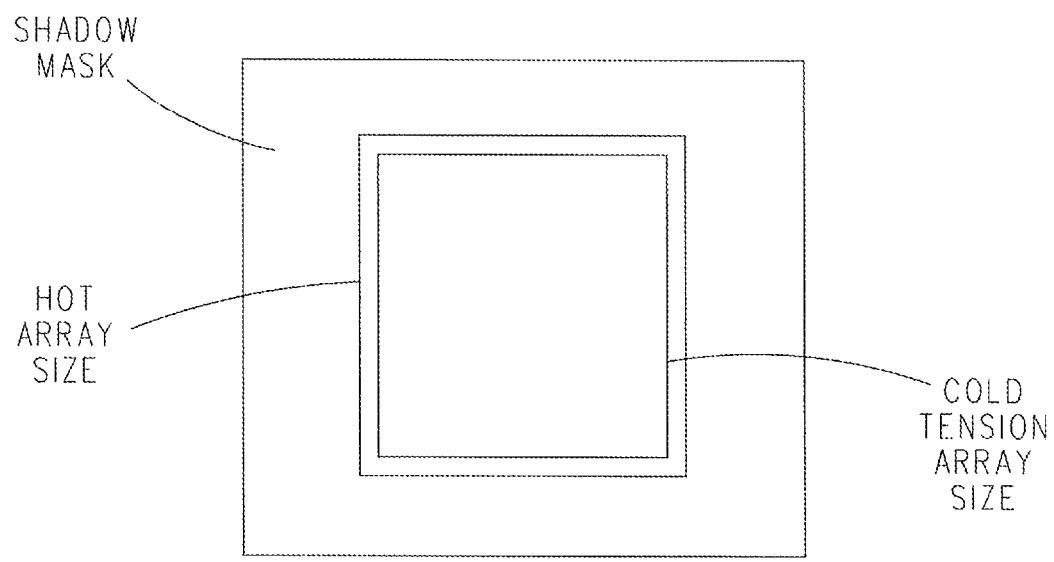
FIG. 2 is an illustration of a difference between a hot array size and a cold, tensioned array size of a shadow mask in accordance with a thermal tensioning process.
Figure 3:
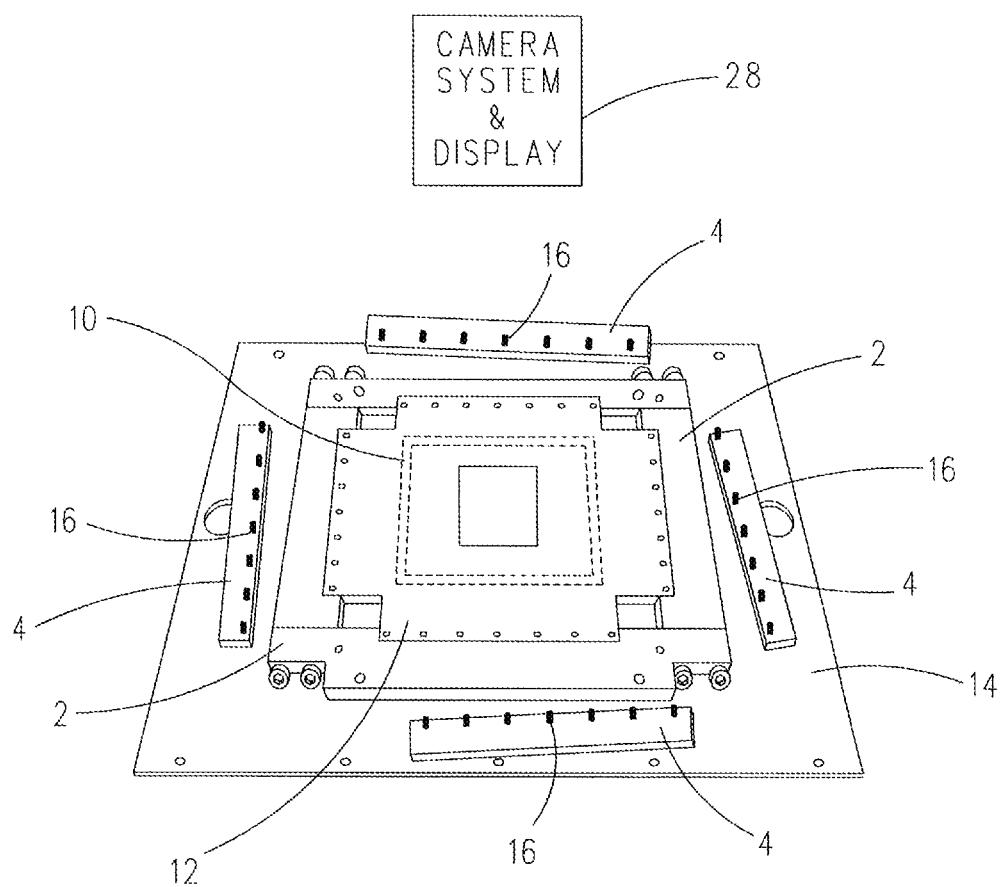
FIG. 3 is a perspective view of a shadow mask disposed on an anchor frame in accordance with an embodiment of the invention.

With reference to FIG. 3, disclosed herein is a shadow mask tensioning system that includes an anchor frame 2, a plurality of anchor bars 4, a tensioning frame 6 (FIG. 5) including a number of tensioning screws 8, a shadow mask frame 10 (shown in phantom in FIG. 3), and a shadow mask 12, all supported by a support plate 14. Anchor frame 2 is a metal frame designed to support shadow mask 12 before and during tensioning. FIG. 3 shows anchor frame 2 and also illustrates the location where shadow mask 12 is affixed to anchor frame 2. Depending on the size constraints for shadow mask frame 10, which in use is positioned between shadow mask 12 and support plate 14 (see FIG. 9), anchor frame 2 could be integrated into shadow mask frame 10 as a single unit.

Figure 4:
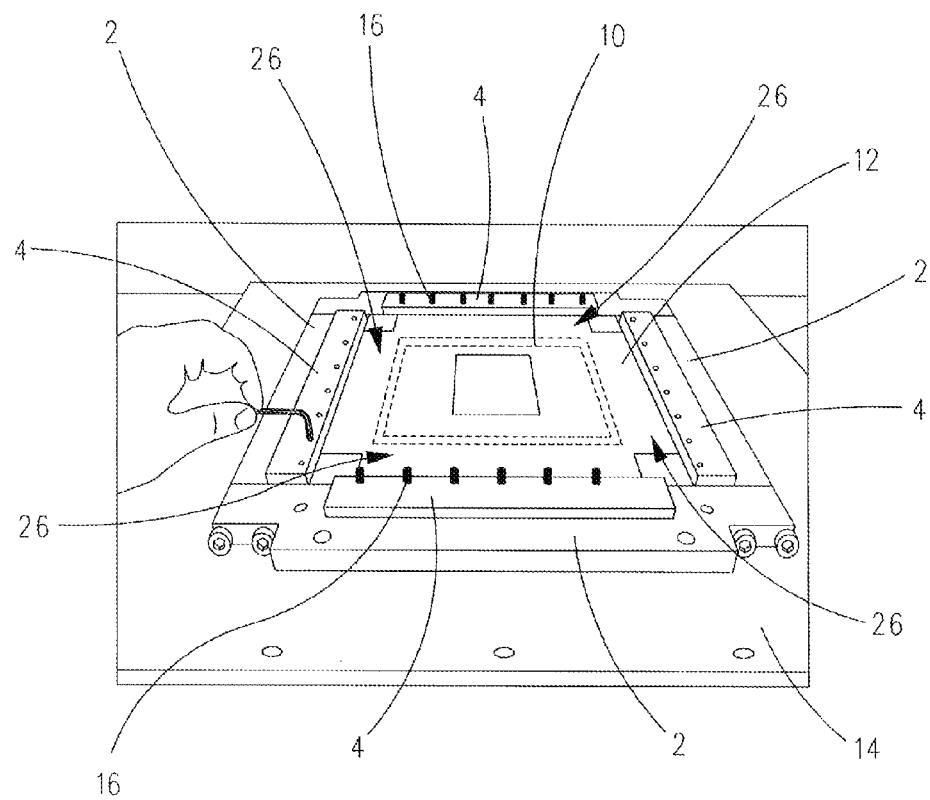
FIG. 4 is a perspective view of anchor bars being attached to the anchor frame to secure or affix the shadow mask to the anchor frame.

With reference to FIG. 4, shadow mask 12 is affixed to anchor frame 2 by clamping the edges of shadow mask 12 to anchor frame 2 with anchor bars 4. Threaded bolts 16 pass through threaded apertures in anchor bars 4 and apertures along the edges of shadow mask 12, and are threaded into threaded holes in anchor frame 2 to secure the edges of shadow mask 12 in fixed locations.

Figure 5:
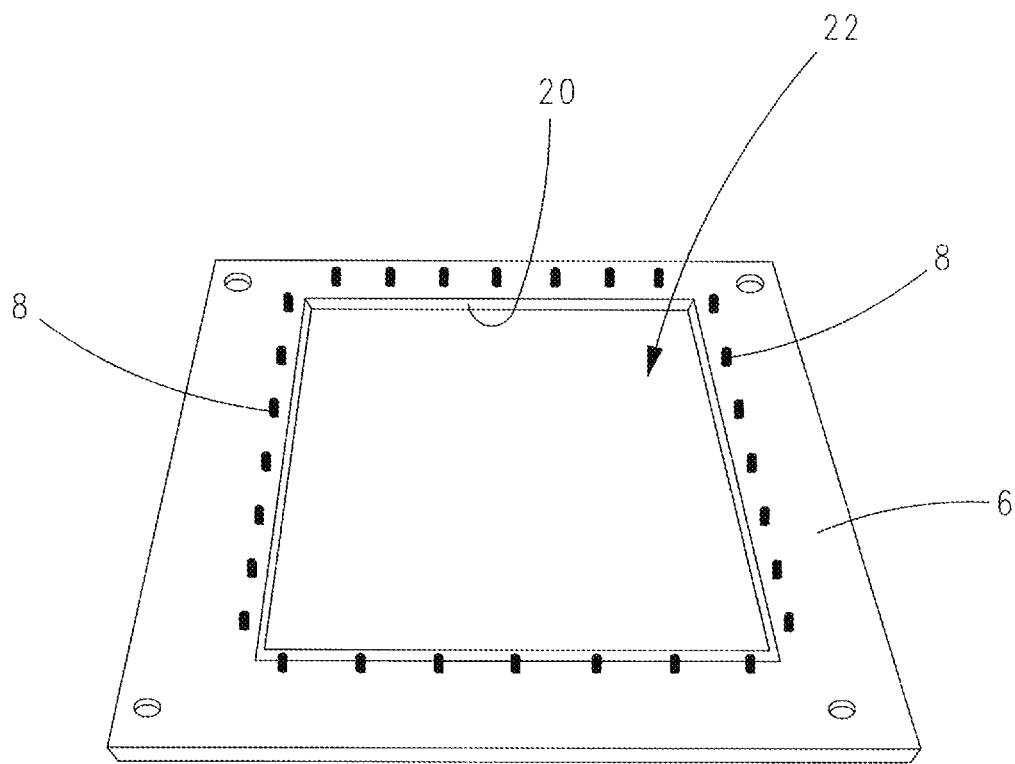
FIG. 5 is an isolated perspective view of a tensioning frame including fine pitched tensioning screws disposed in threaded apertures of the tensioning frame.
Figure 6:
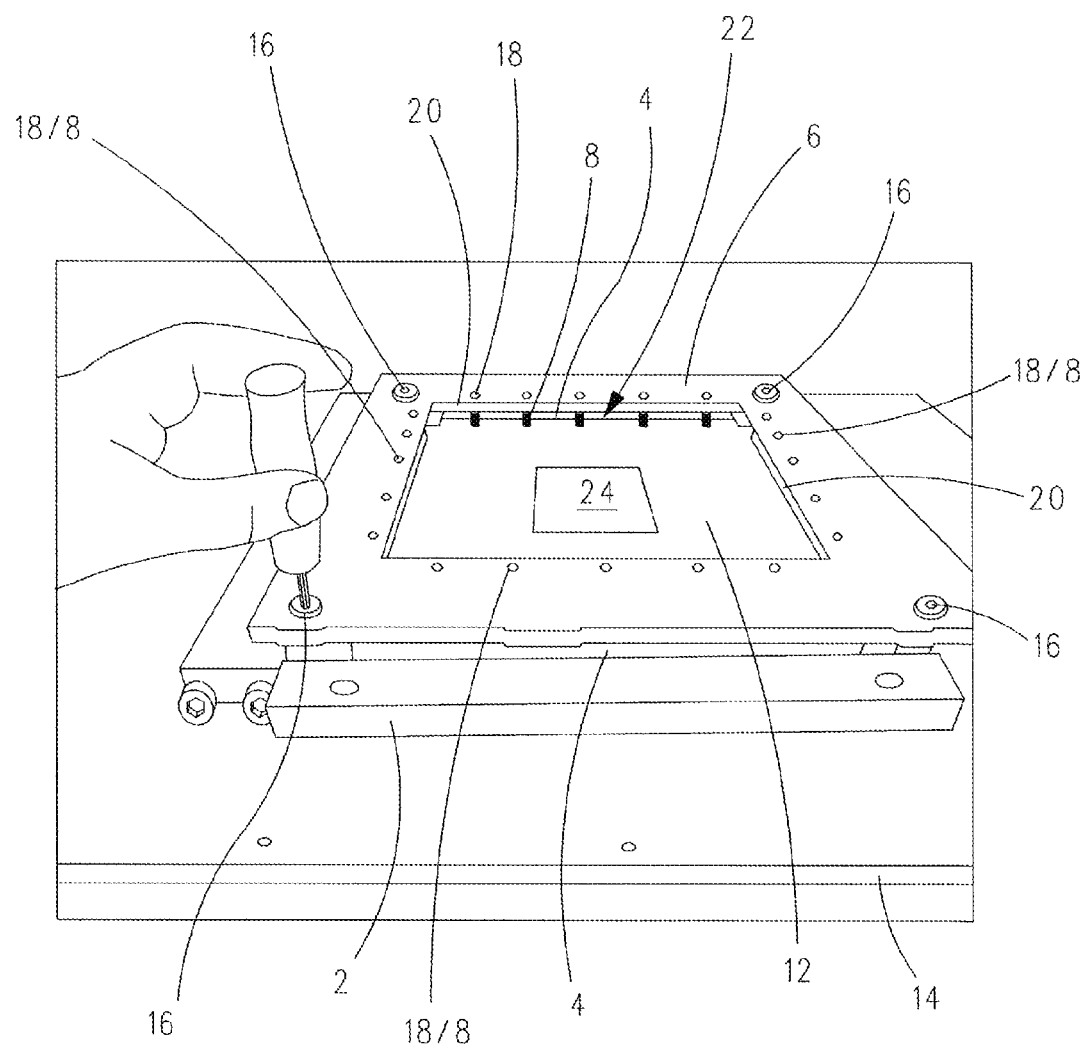
FIG. 6 is a perspective view of the tensioning frame of FIG. 5 being secured to the anchor frame after mounting of the anchor bars to the anchor frame.

With reference to FIGS. 5 and 6, tensioning frame 6 is then attached atop of anchor frame 2 and anchor bars 4 with bolts 16. Tensioning frame 6 includes a series of holes 18 an inner perimeter 20 of an aperture 22 of tensioning frame 6. These holes 18 include either fine pitch threads or inserts which contain fine pitch threads. In either case, fine pitch tensioning screws 8 are threaded through these holes 18 as a means of tensioning shadow mask 12.

Shadow mask frame 10 is a metal frame to which shadow mask 12 is attached. Shadow mask frame 10 facilitates shadow mask 12 being easily handled and aligned for a deposition event and also to fix shadow mask 10 when tensioned at a desired dimension.

Figure 7:
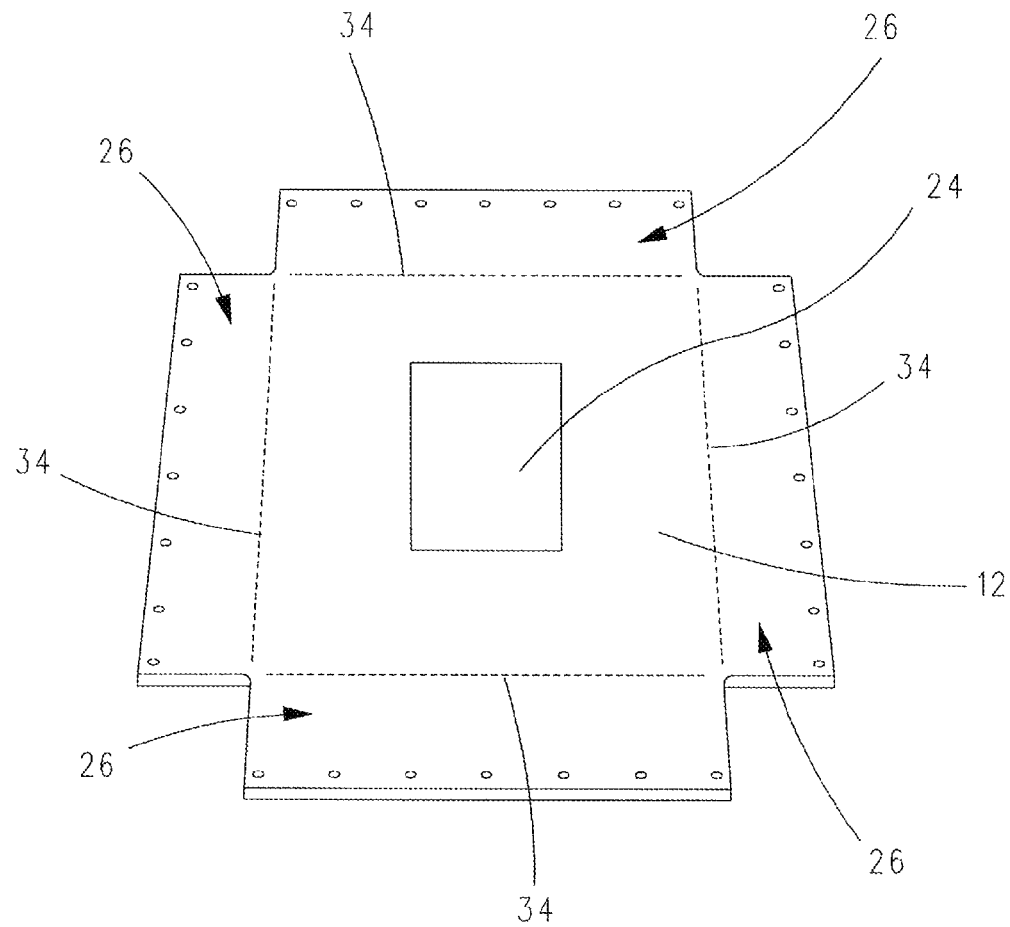
FIG. 7 is an isolated perspective view of the shadow mask including a central array of apertures and edge tabs for tensioning.

With reference to FIG. 7, shadow mask 12 is comprised of a square or rectangular, thin metal foil with an array of apertures 24, desirably formed in a central portion of shadow mask 12. In the illustrated embodiment, shadow mask 12 includes edge tabs 26, which are used to apply tension to shadow mask 12 in the manner described herein.

It is desired for tensioning of shadow mask 12 to occur in a conventional temperature controlled cleanroom environment. The first step is to place shadow mask 12 on anchor frame 2 and shadow mask frame 10 as shown in FIG. 3. Next, anchor bars 4 are attached to anchor frame 2 sandwiching edge tabs 26 therebetween, as shown in FIG. 4. This is followed by attachment of tensioning frame 6 to anchor frame 2, as shown in FIG. 6. Shadow mask 12 can now be tensioned until the array of apertures 24 achieves a desired shape, as determined, for example, by an overhead camera system and visual display 28 (FIG. 3).

Figure 8:
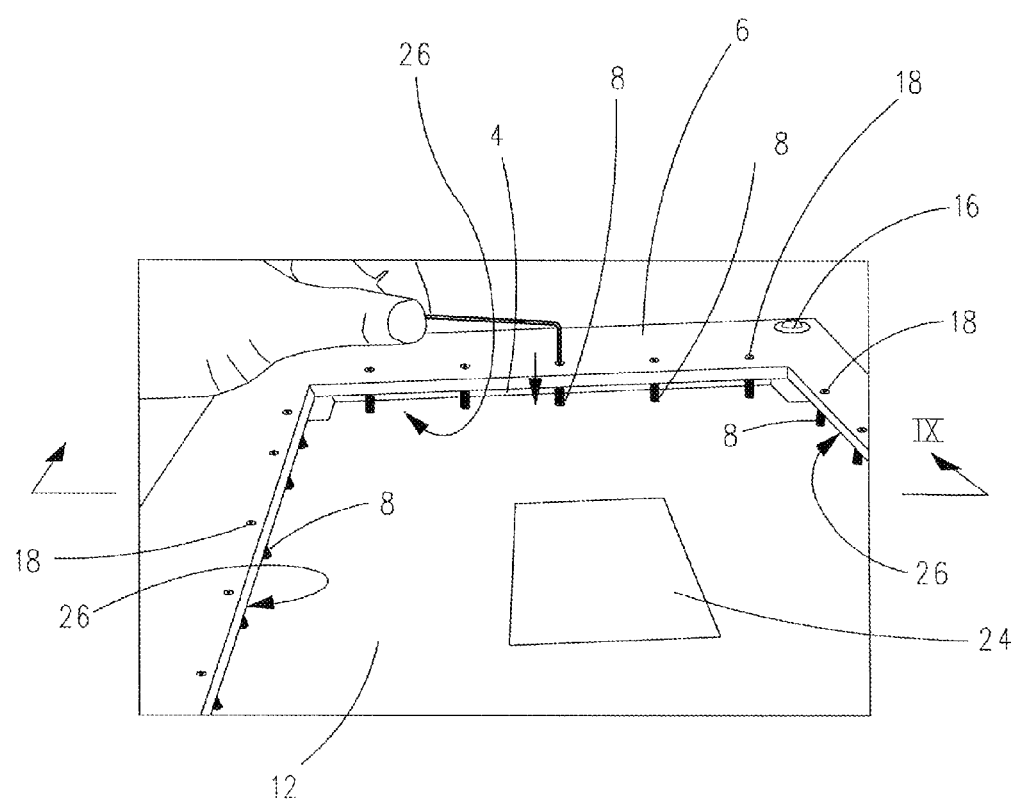
FIG. 8 is an enlarged perspective view of a fine pitch tensioning screw being rotated to press down on an edge tab to create tension in the shadow mask.
Figure 9:
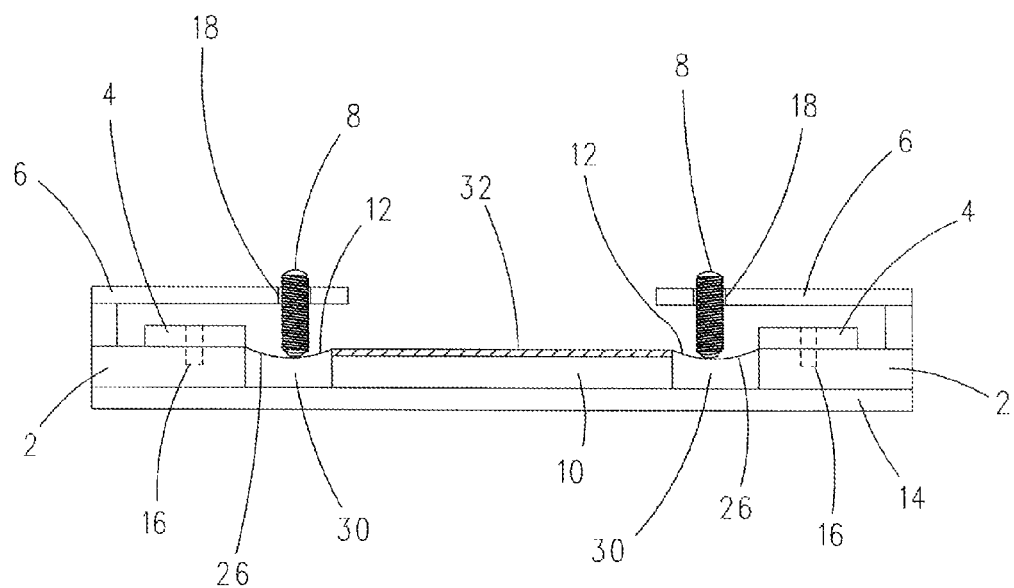
FIG. 9 is a cross-sectional view taken along lines IX-IX in FIG. 8 showing the shadow mask rigidly clamped on both sides with fine pitch tensioning screws pressed into edge tabs, whereupon the shadow mask is stretched across the surface of a shadow mask frame.

With references to FIGS. 8 and 9, tension is applied to shadow mask 12 by tightening fine pitch tensioning screws 8 located in holes 18 of tensioning frame 6. As each tensioning screw 8 presses down on edge tab 26 of shadow mask 12, an interior portion of the edge tab 26 of shadow mask 12 in contact with tensioning screw 8 is forced into a gap 30 (FIG. 9) defined between anchor frame 2 and shadow mask frame 10 whereupon tension is created within shadow mask 12. More specifically, as each fine pitch tensioning screw 8 is extended downward, shadow mask 12 is stretched tight across the surface of shadow mask frame 10. Overall tension and the resulting shape of shadow mask 12 can be varied by adjusting the pressure applied by each tensioning screw 8 on the corresponding edge tab 26 by turning each tensioning screw 8 clockwise and/or counter-clockwise within one of the threaded holes 18 of tensioning frame 6.

When the array of apertures 24 has achieved a desired shape and size, an adhesive 32 (FIG. 9) is applied to bond shadow mask 12 to shadow mask frame 10. Once shadow mask 12 has been bonded, edge tabs 26 are removed from shadow mask 12 in any suitable and/or desirable manner, e.g., cut along dashed lines 34 (FIG. 7) with a utility knife, and shadow mask frame 10 and shadow mask 12 are separated from support plate 14, anchor frame 2, anchor bars 4, tensioning frame 6, etc.

The embodiment described herein has several advantages over the prior art. First, since tension within shadow mask 12 is created by adjustments at numerous locations around the perimeter of shadow mask 12, there is significant flexibility in the shape of the metal foil that comprises shadow mask 12 and, hence, the shape of the array of apertures 24. Horizontal and vertical dimensions of the array of apertures 24 can be adjusted separately. It is also possible to adjust the tension of shadow mask 12 so that the array of apertures 24 does not bow.

Since tensioning of shadow mask 12 can occur in a conventional temperature controlled cleanroom environment, precise metrology of the array of apertures 24 becomes a more simple task. Also, since shadow mask 12 does not go through the "hot" state of being thermally expanded but, instead is tensioned directly in a "cold" state, accurate dimensions of the array of apertures 24 are more easily achieved. This is because the operator does not have to compensate for how they believe the shadow mask dimensions will change when the assembly cools. Finally, since no heat is involved in the tensioning process, there is no chance of burn injury.

The present invention has been described with reference to an exemplary embodiment. Obvious combinations and alterations will occur to others upon reading and understanding the preceding detailed description. It is intended that the invention be construed as including all such modifications and alterations insofar as they come within the scope of the appended claims or the equivalents thereof.

The invention claimed is:

1. A shadow mask tensioning method comprising:
   (a) positioning a shadow mask frame and an anchor frame in spaced relation defining a gap therebetween;
   (b) positioning a shadow mask on the shadow mask frame and the anchor frame with a portion of the shadow mask extending across the gap;
   (c) affixing an edge of the shadow mask to the anchor frame;
   (d) following steps (a)-(c), tensioning the shadow mask by urging the portion of the shadow mask into the gap; and
   (e) following step (d), affixing the shadow mask to the shadow mask frame, wherein step (d) includes adjusting the tension at numerous, spaced locations of the portion of the shadow mask.

2. The method of claim 1, wherein step (c) includes affixing multiple edges of the shadow mask to the anchor frame.

3. The method of claim 1, wherein step (c) includes clamping the edge of the shadow mask between the anchor frame and an anchor bar.

4. The method of claim 1, further including:
   (f) following step (e), separating the shadow mask affixed to the shadow mask frame from the anchor frame.

5. The method of claim 4, wherein step (f) includes cutting the portion of the shadow mask extending across the gap.

6. The method of claim 4, wherein:
   the shadow mask includes an edge tab;
   the portion of the shadow mask is the edge tab;
   step (c) includes affixing the edge tab of the shadow mask to the anchor frame; and
   step (f) includes separating the edge tab from the shadow mask affixed to the shadow mask frame.

7. The method of claim 1, wherein step (d) includes:
   affixing to the anchor frame a tensioning frame that supports one or more tension screws in alignment with the gap, wherein
   adjusting the tension at numerous, spaced locations of the portion of the shadow mask includes adjusting (rotating) each tensioning screw in a manner to urge the portion of the shadow mask into the gap.

8. The method of claim 1, wherein the gap and the portion of the shadow mask surround the shadow mask frame.

9. A shadow mask tensioning apparatus comprising:
   means for supporting a shadow mask with an interior portion of the shadow mask in alignment with a gap;
   means for anchoring one or more edges of the shadow mask; and
   means for individually urging numerous, spaced locations of the interior portion of the shadow mask into the gap.

10. The apparatus of claim 9, wherein the means for supporting includes a shadow mask frame surrounded in spaced relation by an anchor frame defining the gap.

11. The apparatus of claim 10, wherein the gap surrounds the shadow mask frame.

12. The apparatus of claim 9, wherein the means for anchoring includes an anchor bar and the anchor frame sandwiching an edge of the shadow mask therebetween.

13. The apparatus of claim 12, wherein the anchor frame surrounds the shadow mask frame and defines the gap.

14. The apparatus of claim 9, wherein the means for individually urging includes a tensioning frame supporting tensioning screws in alignment with the interior portion of the shadow mask, each tensioning screw operative for individually urging a single location of the interior portion of the shadow mask into the gap in response to rotation of the tensioning screw.

15. The apparatus of claim 14, wherein ends of the tensioning screws urge the interior portion of the shadow mask into the gap in response to rotation of the tensioning screws.

16. The apparatus of claim 14, wherein each edge of the shadow mask includes an edge tab and the means for anchoring anchors each edge tab.

* * * * *